US010283469B1

(12) United States Patent
Yuan et al.

(10) Patent No.: US 10,283,469 B1
(45) Date of Patent: May 7, 2019

(54) METHOD OF FORMING A PASSIVATION LAYER

(71) Applicant: GLOBALFOUNDRIES Inc., Grand Cayman (KY)

(72) Inventors: Qin Yuan, Poughquag, NY (US); Jun Liu, Poughquag, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/795,849

(22) Filed: Oct. 27, 2017

(51) Int. Cl.
*H01L 23/00* (2006.01)
*H01L 21/02* (2006.01)
*G03F 7/20* (2006.01)
*G03F 7/32* (2006.01)
*G03F 7/16* (2006.01)
*G03F 7/038* (2006.01)

(52) U.S. Cl.
CPC ............ *H01L 24/03* (2013.01); *G03F 7/0387* (2013.01); *G03F 7/162* (2013.01); *G03F 7/168* (2013.01); *G03F 7/2002* (2013.01); *G03F 7/32* (2013.01); *H01L 21/02118* (2013.01); *H01L 21/02282* (2013.01); *H01L 21/02345* (2013.01); *H01L 2224/0391* (2013.01); *H01L 2924/07025* (2013.01); *H01L 2924/3511* (2013.01); *H01L 2924/35121* (2013.01)

(58) Field of Classification Search
CPC . G03F 7/16–7/18; G03F 7/2002–7/201; H01L 21/02109–21/02118; H01L 21/02318–21/02362; C23C 14/58–14/5893
See application file for complete search history.

(56) References Cited

U.S. PATENT DOCUMENTS

2005/0191836 A1 9/2005 Tzeng et al.
2016/0086960 A1\* 3/2016 Wen ................... H01L 27/11507
257/295

\* cited by examiner

*Primary Examiner* — Sonya D. McCall-Shepard
(74) *Attorney, Agent, or Firm* — Anthony Canale; Hoffman Warnick LLC

(57) ABSTRACT

A method of forming a passivation layer on an integrated circuit (IC) chip including a device layer on a substrate. The method may include forming a crosslinked precursor passivation layer on the IC chip, and curing the crosslinked precursor passivation layer at a first temperature to form a passivation layer. The method may further include maintaining the device layer at a second, lower temperature during the curing of the crosslinked precursor passivation layer. Maintaining the device layer at the second, lower temperature may mitigate and/or prevent damage to the device layer conventionally caused by exposure to the first temperature during the curing of the crosslinked precursor passivation layer. The method may include using a curing system including a chamber, an infrared source for controlling the first temperature for curing the crosslinked precursor passivation layer, and a temperature control device for controlling the second, lower temperature of the device layer.

20 Claims, 8 Drawing Sheets

METHOD OF FORMING A PASSIVATION LAYER

BACKGROUND

Technical Field

The present disclosure relates to integrated circuit technology, and more specifically, to methods of forming a passivation layer on an integrated circuit (IC) chip.

Related Art

Integrated circuit (IC) chips can include billions of interconnected devices, such as transistors, resistors, capacitors, and diodes, located in layers of materials. The quality and viability of a product including an IC chip can be at least partially dependent on the techniques used for fabricating and packaging the IC chips and the structure of various components therein. Fabrication of an IC chip can include two phases: front-end-of-line processes (FEOL) and back-end-of-line processes (BEOL). FEOL generally includes fabrication processes performed on a wafer up to and including the formation of gate materials (e.g., a polysilicon gate) for a transistor structure. A group of vertically-extending conductive contacts can provide electrical connections to the transistor from other functional elements of a circuit. BEOL generally includes fabrication processes following the formation of materials in FEOL processing, including the formation of all metal levels in the structure. Each metal level can include metal wires therein, which can be connected to other metal levels through vertically-oriented conducting wires known as vias. In conventional BEOL processing, a layer of vias is formed to connect devices in an IC chip to a layer of metal wires formed on top of the vias, with a successive layer of vias formed thereon, followed by another layer of metal wires, etc.

Following fabrication, integrated circuit (IC) chips are typically separated (i.e., diced) and assembled into semiconductor chip packages which are soldered to a printed circuit board during a process referred to as "far back end of line (FBEOL)." One type of semiconductor chip package is a flip chip. In flip chip processing of IC chips, solder bumps such as controlled collapse chip connect (C4) solder balls can be implemented to connect IC chips to packaging and/or to each other. Before connecting the IC chips to packaging and/or each other, passivation layers, such as a photosensitive polyimide (PSPI) may be formed on the IC chips to prevent and/or mitigate damage to the IC chips during and/or after packaging. For example, passivation layers may reduce warpage of the IC chip wafer, and prevent peeling stress of the ultralow-dielectric constant (ULK) material of the metal levels of the IC chip.

Conventional formation of a passivation layer generally includes a pre-bake process and high temperature curing process. During the high temperature curing process, the entire IC chip is typically exposed to temperatures as high as 450 degrees Celsius for anywhere from 10 minutes to 5 hours. One issue associated with this conventional curing method includes reduced IC chip performance caused by the exposure to the high temperature of the curing process. For example, exposing the entire IC chip to the requisite high temperature of the curing process may result in thermal degradation of the device layer.

SUMMARY

A first aspect of the disclosure is directed to a method of forming a passivation layer on an integrated circuit (IC) chip, the method including: providing the IC chip including a device layer positioned on a substrate; forming a precursor passivation layer on the IC chip above the device layer; curing the precursor passivation layer at a first temperature to form the passivation layer; and during the curing of the precursor passivation layer, maintaining the device layer of the IC chip at a second, lower temperature to prevent thermal degradation of the device layer.

A second aspect of the disclosure is related to a method of forming a passivation layer of an integrated circuit (IC) chip including a device layer therein, the method including: crosslinking at least a portion of a precursor passivation layer on the IC chip to form a crosslinked precursor passivation layer; and using a radiation source, curing the crosslinked precursor passivation layer at a first temperature to form the passivation layer while using a temperature control device to maintain the device layer at a second, lower temperature to prevent thermal degradation of the device layer.

A third aspect of the disclosure is related to a method of forming a polyimide layer on an integrated circuit (IC) chip including a device region therein, the method including: spin-coating a photosensitive polyimide (PSPI) precursor layer on the IC chip above the device layer; crosslinking at least a portion of the PSPI precursor layer to form a crosslinked PSPI precursor layer; providing a curing system, the curing system including: a chamber, a radiation source positioned on a first internal surface of the chamber, and a temperature control device positioned on a second internal surface of the chamber, the second internal surface being opposite of the first internal surface; placing the IC chip and crosslinked PSPI precursor layer in the chamber, including positioning the device layer on the temperature control device of the curing system, wherein an uppermost surface of the crosslinked PSPI precursor layer is exposed to radiant energy of the radiation source; purging the curing system with an inert gas; and using the radiation source, curing the crosslinked PSPI precursor layer at a first temperature to form a polyimide layer while maintaining the device layer at a second, lower temperature to prevent thermal degradation of the device layer.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Embodiments of the present disclosure provide a method for forming a passivation layer on an integrated circuit (IC) chip which mitigates and/or prevents damage to the device layer of the IC chip during such formation. Methods according to the disclosure may include curing the passivation layer at a first temperature, while also maintaining the device layer at a second, lower temperature during the curing. The methods according to the disclosure may further include the use of a cure system for controlling the first temperature and the second, lower temperature. For example, the cure system may include a thermal source for controlling the temperature of the curing process, and a temperature control plate for controlling the temperature of the device layer during the curing process. Embodiments of the disclosure may mitigate and/or prevent damage conventionally caused to the device layer by exposure to the first temperature of the curing process.

Figure 1:
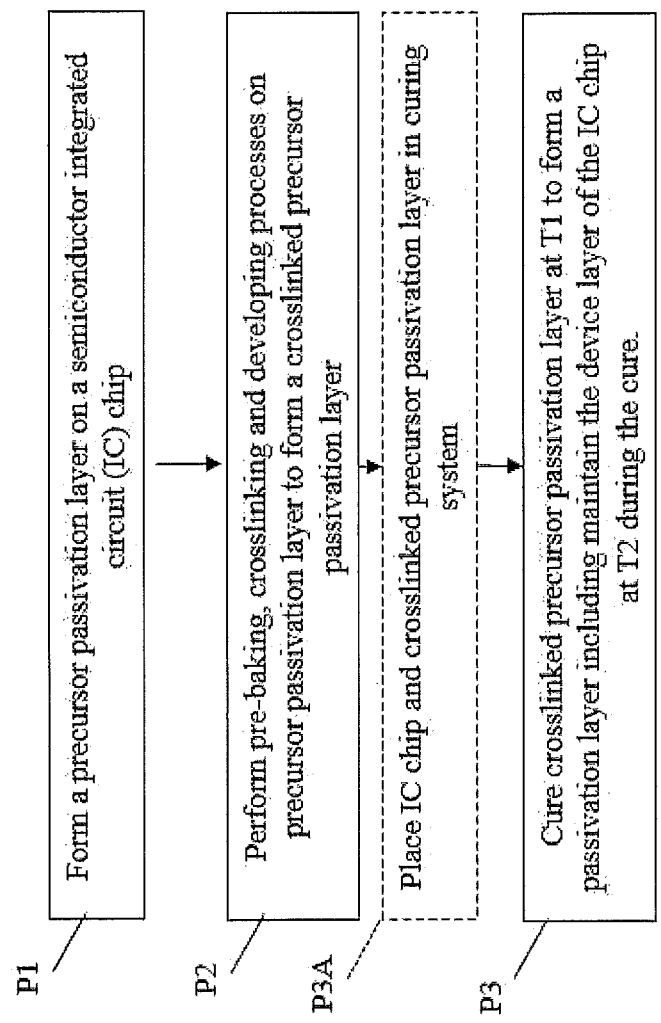
FIG. 1 shows a flow chart of a method for forming a passivation layer on an integrated circuit (IC) chip, according to embodiments of the disclosure.

Turning to the figures, FIG. 1 shows a flow diagram illustrating processes according to various embodiments of the disclosure. The processes shown in FIG. 1 are described in conjunction with FIGS. 2-7, depicting cross-sectional views of an integrated circuit (IC) chip as a passivation layer is being formed thereon. The IC chip shown in FIGS. 2-7 (i.e., IC chip 100) is an example IC structure intended merely to illustrate various aspects of the disclosure. It is understood that the passivation layer formed according to embodiments of the disclosure may be formed on any desirable IC chip.

Figure 2:
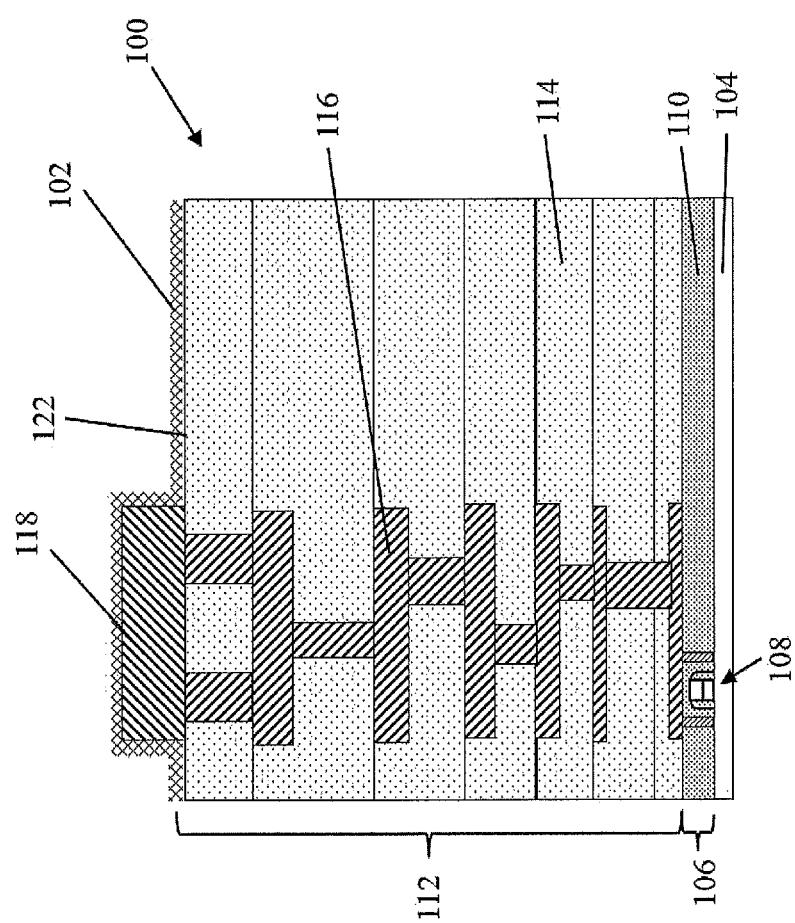
FIG. 2 shows a cross-sectional view of forming a precursor passivation layer on an IC chip, according to embodiments of the disclosure.

Returning to FIG. 1, processes according to various embodiments can include a Process P1 of forming a precursor passivation layer on an IC chip. As will be discussed herein, the precursor passivation layer may be processed to form a passivation layer for protecting the IC chip during and after packaging. Process P1 is described herein with reference to FIG. 2. FIG. 2 shows a cross-sectional view of an illustrative example of a precursor passivation layer 102 on an IC chip 100.

As shown in FIG. 2, IC chip 100 includes a device layer 106 positioned on a substrate 104. Substrate 104 may include a bulk substrate or a silicon-on-insulator (SOI) substrate. Device layer 106 may be formed on substrate 104 to include various integrated circuit (IC) devices (e.g., transistor 108) for a semiconductor device. Device layer 106 may include a region of interlayer dielectric (ILD) 110 for electrically insulating IC devices formed therein. Integrated circuit (IC) devices such as transistor 108 may be formed within ILD region 110. Although one transistor is shown in FIG. 2, it is understood that device layer 106 may include any desirable number and type of IC devices. As shown in FIG. 2, IC chip 100 may also include a back-end-of-line (BEOL) section 112 formed on device layer 106 to electrically connect the IC devices (e.g., transistor 108) of device layer 106 to one another, and/or to integrated circuit (IC) packaging during subsequent packaging of the IC chip, etc. BEOL section 112 may include a group of insulator material layers 114 providing different amounts of electrical insulation. BEOL section 112 may include any desirable number of insulator material layers 114 for an integrated circuit (IC) chip. For example, insulator material layers 114 can be formed as a group of insulating layers, each of which can be separately processed to include trenches, cavities, etc. As shown in FIG. 2, insulator material layers 114 can each include a plurality of metal wires 116 formed therein for providing electrical connections between devices, e.g., transistor 108, of device layer 106 and other IC structures as discussed above. IC chip 100 may also include a bond pad 118 positioned on BEOL section 112. Bond pad 118 may electrically connect wires 116 to integrated circuit (IC) packaging during subsequent packaging of the IC chip. It is understood that IC chip 100 including substrate 104, device layer 106, and BEOL section 112 may be formed using conventional semiconductor fabrication techniques and materials.

As shown in FIG. 2, and according to process P1 of FIG. 1, precursor passivation layer 102 may be formed on IC chip 100. As discussed herein, precursor passivation layer 102 may be processed to form a passivation layer for protecting the components of IC chip during and after packaging. As shown in FIG. 2, precursor passivation layer 102 may be formed, for example, on an uppermost surface 122 of IC chip 100 above BEOL section 112, and on exposed portions of bond pad 118. In another example not shown, a first passivation layer may have been previously formed on uppermost surface 122 of IC chip 100 adjacent to bond pad 118, and precursor passivation layer 102 may be formed on the first passivation layer and exposed portions of bond pad 118. Precursor passivation layer 102 may include photosensitive polyimide (PSPI) precursor, and/or any other now known or later developed precursor passivation layer material. Precursor passivation layer 102 may be formed on IC chip 100, for example, by a deposition process such as spin-coating. As used herein, "deposition" or "depositing" a material (e.g., interconnect pad 110) may include any now known or later developed technique appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, in addition to other deposition processes currently known or later developed.

Returning to FIG. 1, in various embodiments, following Process P1, a second process, Process P2 can include pre-cure processing of precursor passivation layer 102 (FIG. 2). Pre-cure processing may include, for example, pre-baking, crosslinking and developing precursor passivation layer 102 (FIG. 2). As used herein, the term "crosslink" may include the formation of chemical bonds, e.g., covalent bonds or ionic bonds, between polymer groups of precursor passivation layer 102 (FIG. 2).

Figure 3:
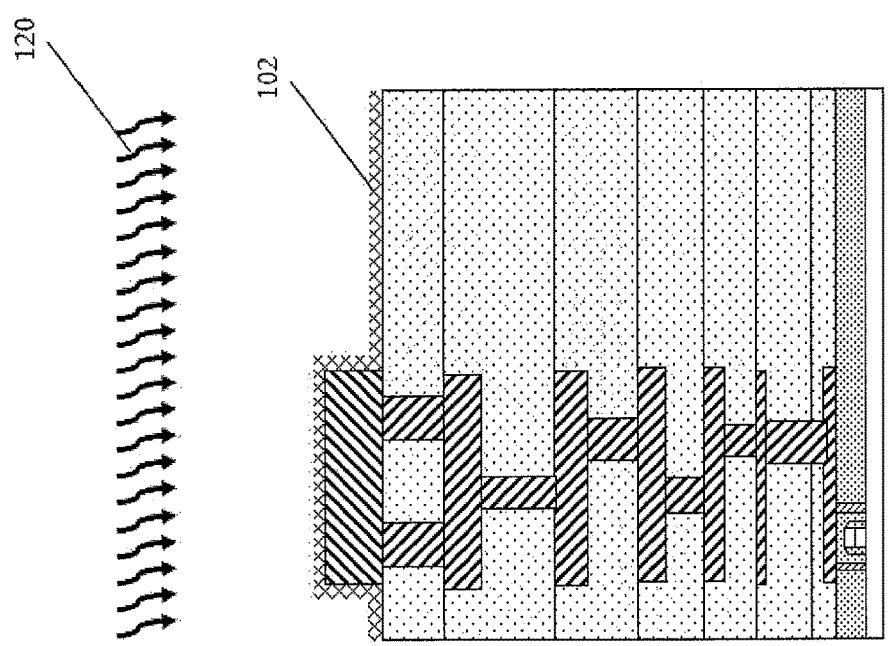
FIG. 3 shows a cross-sectional view of pre-baking the precursor passivation layer of FIG. 2, according to embodiments of the disclosure.
Figure 4:
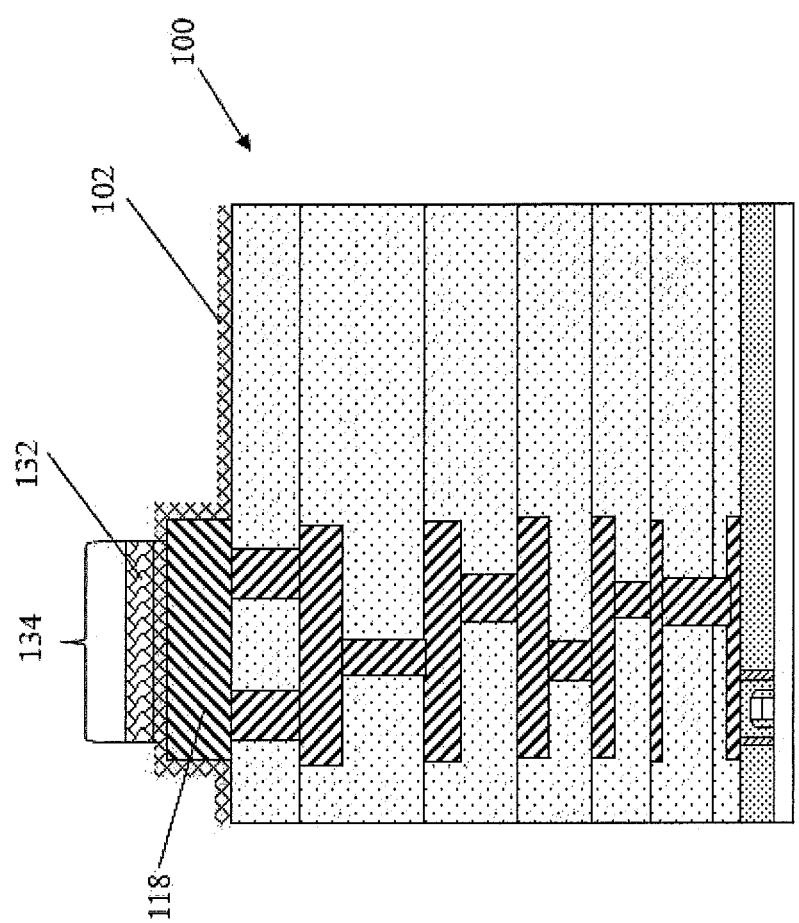
FIG. 4 shows a cross-sectional view of processing the precursor passivation layer of FIG. 3, according to embodiments of the disclosure.
Figure 5:
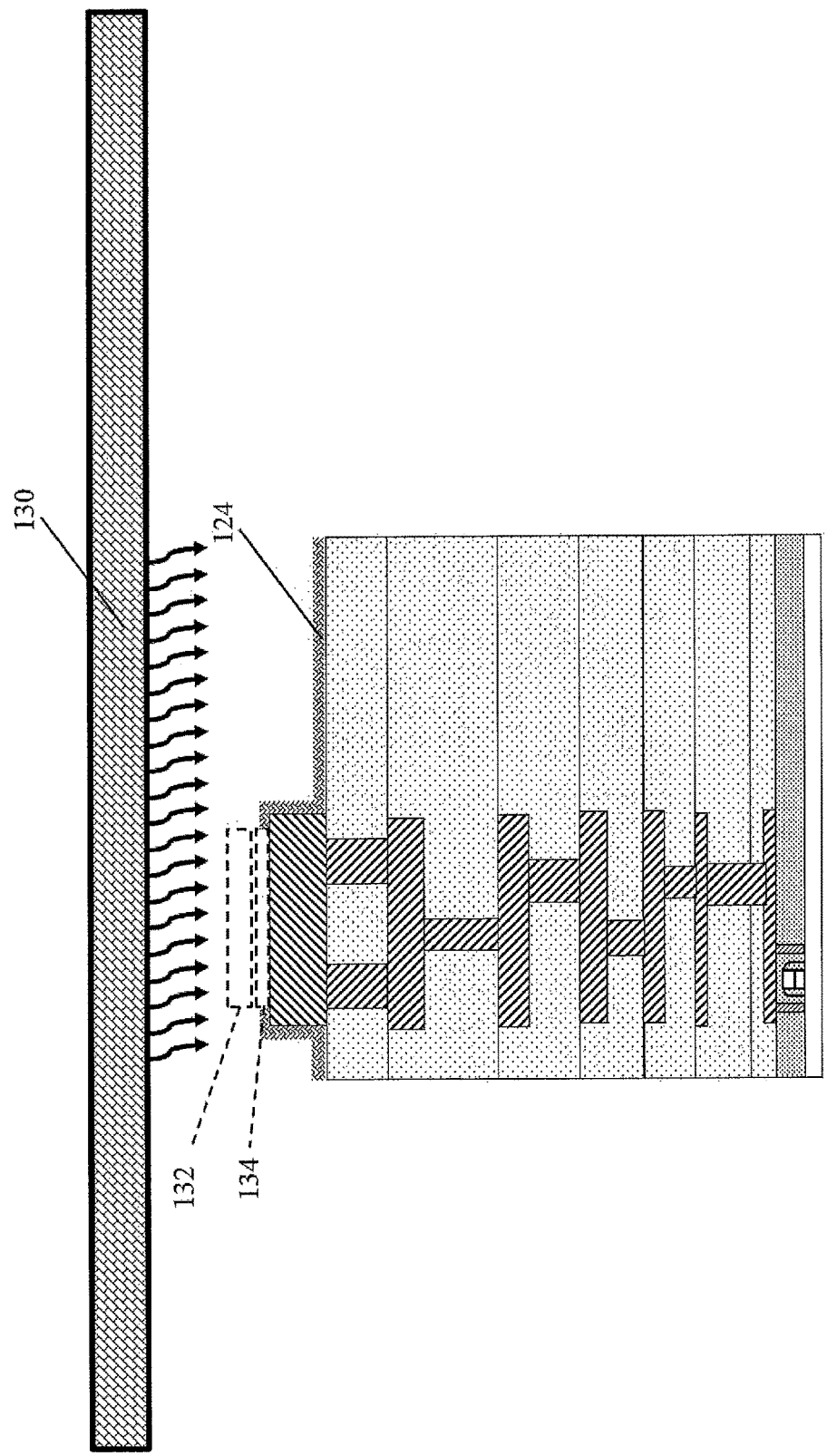
FIG. 5 shows a cross-sectional view of further processing the precursor passivation layer of FIG. 4 to form a crosslinked precursor passivation layer, according to embodiments of the disclosure.

Process P2 is described herein with reference to FIGS. 3-5. FIG. 3 shows pre-baking precursor passivation layer 102, before crosslinking the layer as described herein. Pre-baking precursor passivation layer 102 may, for example, drive off unwanted solvents in the layer, and thicken the layer. Pre-baking precursor passivation layer 102 may include, for example, exposing the precursor passivation layer to a thermal source 120 to heat the precursor passivation layer 102 (FIG. 2) to a temperature of approximately 90 degrees Celsius to approximately 120 seconds. Thermal source 120 may include, for example, a conventional thermal oven, and/or any other now known or later developed thermal source for heating a precursor passivation layer.

FIG. 4, shows applying a mask 132 over a portion 134 of precursor passivation layer 102, before exposing the layer for crosslinking. Forming mask 132 over portion 134 of precursor passivation layer 102 may prevent the masked portion from crosslinking during the subsequent exposure to an ultraviolet (UV) radiation source, and thereby allow the portion to be removed during the developing process and before forming a final passivation layer. For example, as shown in FIG. 4, mask 132 may allow portion 134 of precursor passivation layer 102 to be removed during the developing process after the pre-bake and crosslinking processes. Mask 132 may be purchased directly from commercial suppliers or formed, for example, by deposition and patterned etching. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as shallow trench isolation (STI) trenches.

FIG. 5 shows crosslinking precursor passivation layer 102 (FIG. 4). Crosslinking precursor passivation layer 102 (FIG. 4) may cause the precursor passivation layer 102 (FIG. 4) to form a crosslinked precursor passivation layer 124 in the exposed area not covered by mask 132 (in phantom). Crosslinked precursor passivation layer 124 may be insoluble to the developer used during a subsequent developing process, while non-crosslinked portion 134 (in phantom) covered by mask 132 (in phantom) may be soluble to the developer. As shown in FIG. 5, crosslinking precursor passivation layer 102 (FIG. 4) may include exposing the precursor passivation layer and mask 132 (in phantom) to an ultraviolet (UV) radiation source 130 for approximately 15 minutes. For example, precursor passivation layer 102 may include a crosslinking agent (not labeled) that causes chemical bonds to form between polymer groups of the precursor passivation layer upon exposure to UV radiation source 130.

FIG. 5 also shows removing mask 132 (in phantom) and developing crosslinked precursor passivation layer 124 and portion 134 (in phantom) of precursor passivation layer 102 (FIG. 2). Mask 132 may be removed, for example, by etching, e.g., RIE. Developing crosslinked precursor passivation layer 124 and portion 134 (in phantom) of precursor passivation layer 102 (FIG. 2) may include exposing the layers to a developing solvent. The developer may include, for example, organic solvents and/or any other now known or later developed developer. As discussed above, portion 134 (in phantom) of precursor passivation layer 102 (FIG. 4) may be soluble to developer and therefore may be removed during the developing process. Crosslinked precursor passivation layer 124 may be insoluble to developer and therefore remain after the developing process.

Returning to FIG. 1, in various embodiments, following Process P2, a third process, Process P3 can include curing crosslinked precursor passivation layer 124 (FIG. 5) at a first temperature to form a passivation layer, while also maintaining device layer 106 (FIG. 2) of IC chip 100 (FIG. 2) at a second, lower temperature. In contrast to conventional curing processes for forming a passivation layer, maintaining device layer 106 (FIG. 2) at a second, lower temperature during the curing process may prevent and/or mitigate damage to the device layer generally caused by exposure to the high temperature of the curing process.

Figure 6:
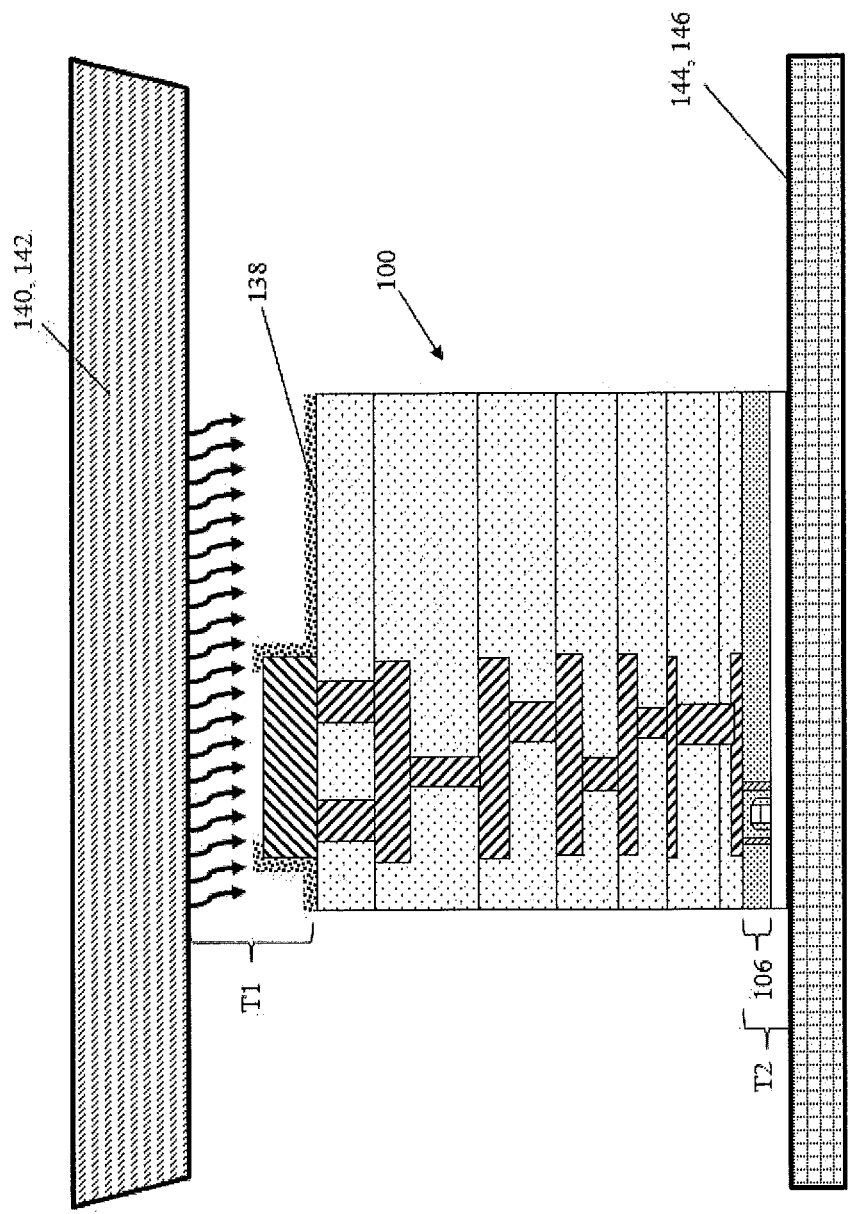
FIG. 6 shows a cross-sectional view of curing the crosslinked precursor passivation layer of FIG. 5 to form a passivation layer, according to embodiments of the disclosure.

Process P3 is described herein with reference to FIG. 6. FIG. 6 shows curing crosslinked precursor passivation layer 124 (FIG. 5) at a first temperature T1 to form passivation layer 138. FIG. 6 also shows maintaining device layer 106 of IC chip 100 at a second, lower temperature T2 during the curing process to prevent damage to device layer 106 which may be caused by exposure to first temperature T1.

As shown in FIG. 6, curing crosslinked precursor passivation layer 124 (FIG. 5) may include exposing the layer to a thermal source 140 to heat the layer to first temperature T1. Curing crosslinked precursor passivation layer 124 (FIG. 5) at first temperature T1 may, for example, drive off volatiles including residual solvents and crosslinking agent therein, and form a chemically and/or mechanically stable passivation layer 138. For example, as illustrated in the examples of FIGS. 5 and 6, where crosslinked precursor passivation layer 124 (FIG. 5) is a photosensitive polyimide (PSPI) precursor, curing the layer at first temperature T1 may imidize the PSPI precursor to form polyimide as passivation layer 138.

First temperature T1 may be approximately 30 degrees Celsius to approximately 450 degrees Celsius. The curing may include a duration of approximately 10 minutes to approximately 5 hours.

Thermal source 140 for curing crosslinked precursor passivation layer 124 (FIG. 5) may include, for example, an infrared source, a laser source, a conventional thermal heater and/or any other now known or later developed thermal source for curing a crosslinked precursor passivation layer to form a passivation layer. In the example of FIG. 6, an infrared source 142 may be used to directly heat the precursor passivation layer by radiation heat transfer. In addition to maintaining device layer 106 at second, lower temperature T2 as described herein, using infrared source 142 may further mitigate and/or prevent the heat from also being transferred to portions of IC chip 100. As used herein, the term "radiation heat transfer" may include heat transfer in the form of electromagnetic waves, mainly in the infrared region. Radiation heat transfer may allow for transfer of heat directly to the first object in the path of the electromagnetic waves, without transferring heat to the surrounding air. Exposing crosslinked precursor passivation layer 102 (FIG. 5) to infrared source 142 may therefore allow the layer to be cured at first temperature T1, and mitigate and/or prevent heat being transferred to IC chip 100 through the surrounding air.

FIG. 6 also shows maintaining device layer 106 of IC chip 100 at second, lower temperature T2 during the curing of crosslinked precursor passivation layer 124 (FIG. 5). As discussed above, maintaining device layer 106 at second, lower temperature T2 may prevent and/or mitigate the damage conventionally caused to the device layer by exposure to the high temperature, e.g., first temperature T1, of the curing process. Second, lower temperature T2 may be approximately 20 degrees Celsius to approximately 350 degrees Celsius.

As shown in the example of FIG. 6, a temperature control device 144 may be used to maintain device layer 106 at second, lower temperature T2 during the curing of crosslinked precursor passivation layer 124 (FIG. 5). As also shown in the example of FIG. 6, temperature control device 144 may include a thermoelectric coolant system 146 for maintaining device layer 106 at second, lower temperature T2. Although thermoelectric coolant system 146 is shown, temperature control device 144 may alternatively include, for example, a liquid coolant channel system, and/or any other now known or later developed coolant system.

Returning to FIG. 1, in various embodiments, an optional third process, Process P3A can include: placing IC chip 100 and crosslinked precursor passivation layer 124 of FIG. 5 in a curing system before curing the crosslinked precursor passivation layer. The curing system may be used, for example, for controlling the temperatures for curing the crosslinked precursor passivation layer at the first temperature, and maintain the device layer at the second, lower temperature.

Figure 7:
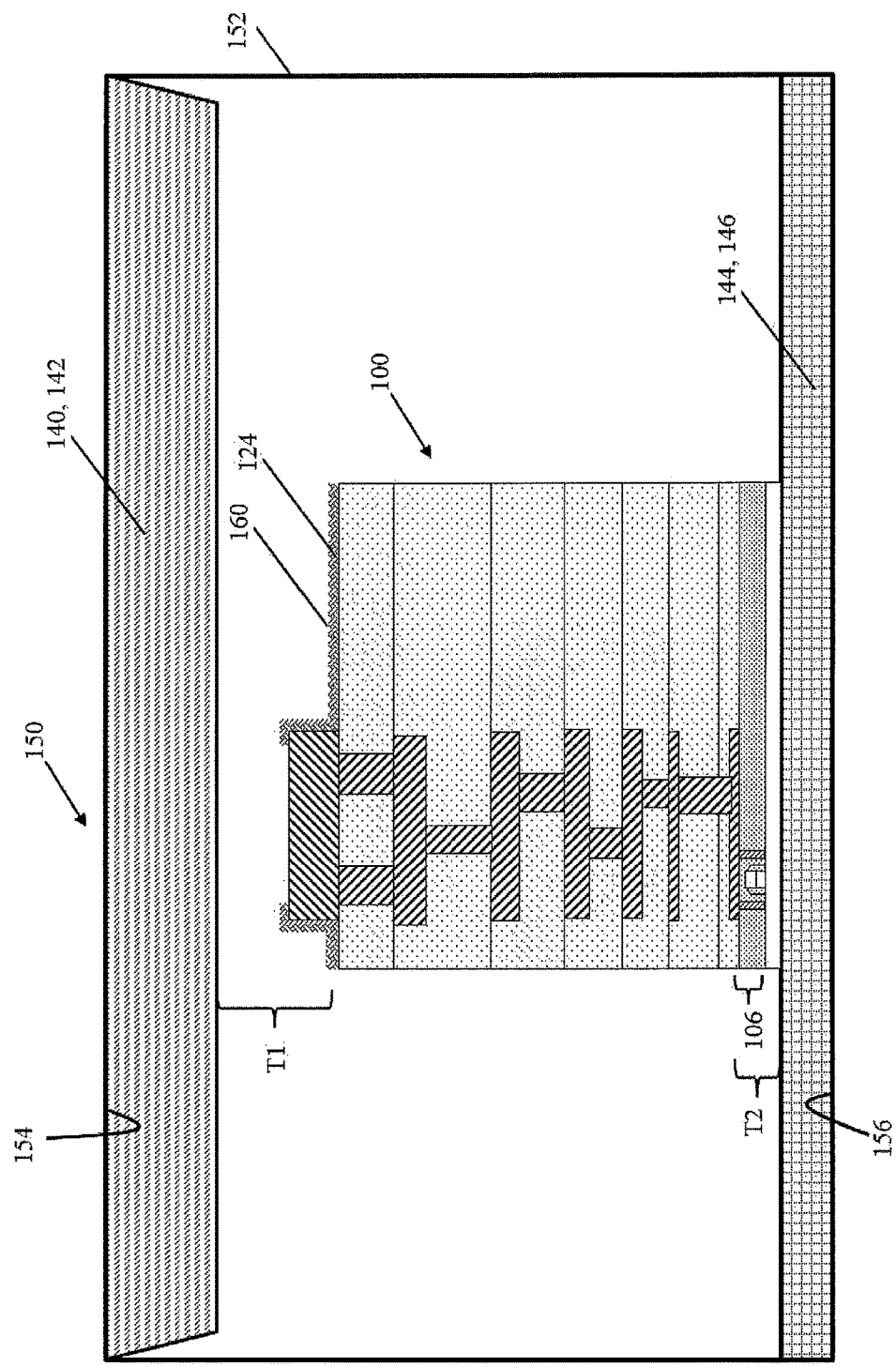
FIG. 7 shows a cross-sectional view of placing the IC chip and crosslinked precursor passivation layer of FIG. 5 in a curing system, according to embodiments of the disclosure.

Process P3A is described herein with reference to FIG. 7. FIG. 7 shows placing IC chip 100 and crosslinked precursor passivation layer 124 in a curing system 150. Curing system 150 may include a chamber 152 for maintaining the surrounding environment for curing crosslinked precursor passivation layer 124. Curing system 150 may also include, for example, thermal source 140 on a first internal surface 154 of chamber 152. Thermal source 140 may, for example, control first temperature T1 for curing crosslinked precursor passivation layer 124. In the example of FIG. 7, thermal source 140 may include an infrared source 142. In additional non-limiting examples, thermal source 140 may include a solar source, a laser source, and/or any other now known or later developed thermal sources for curing a crosslinked precursor passivation layer. Curing system 150 may also include, for example, temperature control device 144 on a second internal surface 156 of chamber 152, opposite of first internal surface 154. Temperature control device 144 may, for example, control second, lower temperature T2 of device layer 106 of IC chip 100. In the example of FIG. 7, temperature control device 144 may include thermoelectric coolant system 146. As discussed above, temperature control device 144 may alternatively include, for example, a liquid coolant channel flow system, and/or any other now known or later developed coolant system.

Placing IC chip 100 and crosslinked precursor passivation layer 124 thereon in curing system 150 may include, for example, placing device layer 106 proximate to temperature control device 144, and crosslinked precursor passivation layer 124 proximate to thermal source 140. As used herein, the phrase "proximate" with respect to temperature control device 144 may include positioning device layer 106 with respect to temperature control device 144 such that temperature control device 144 can control the temperature of device layer 106, for example, by convection, conduction, or radiation heat. As used herein, the phrase "proximate" with respect to thermal source 140 may include positioning crosslinked precursor passivation layer 124 with respect to thermal source 140 such that thermal source 140 can control the temperature of crosslinked precursor passivation layer 124, for example, by convection, conduction, or radiation. For example, as shown in FIG. 6, substrate 104 of IC chip 100 may be placed on temperature control device 144 such that an uppermost surface 160 of crosslinked precursor passivation layer 124 is exposed to the radiant energy of thermal source 140.

Figure 8:
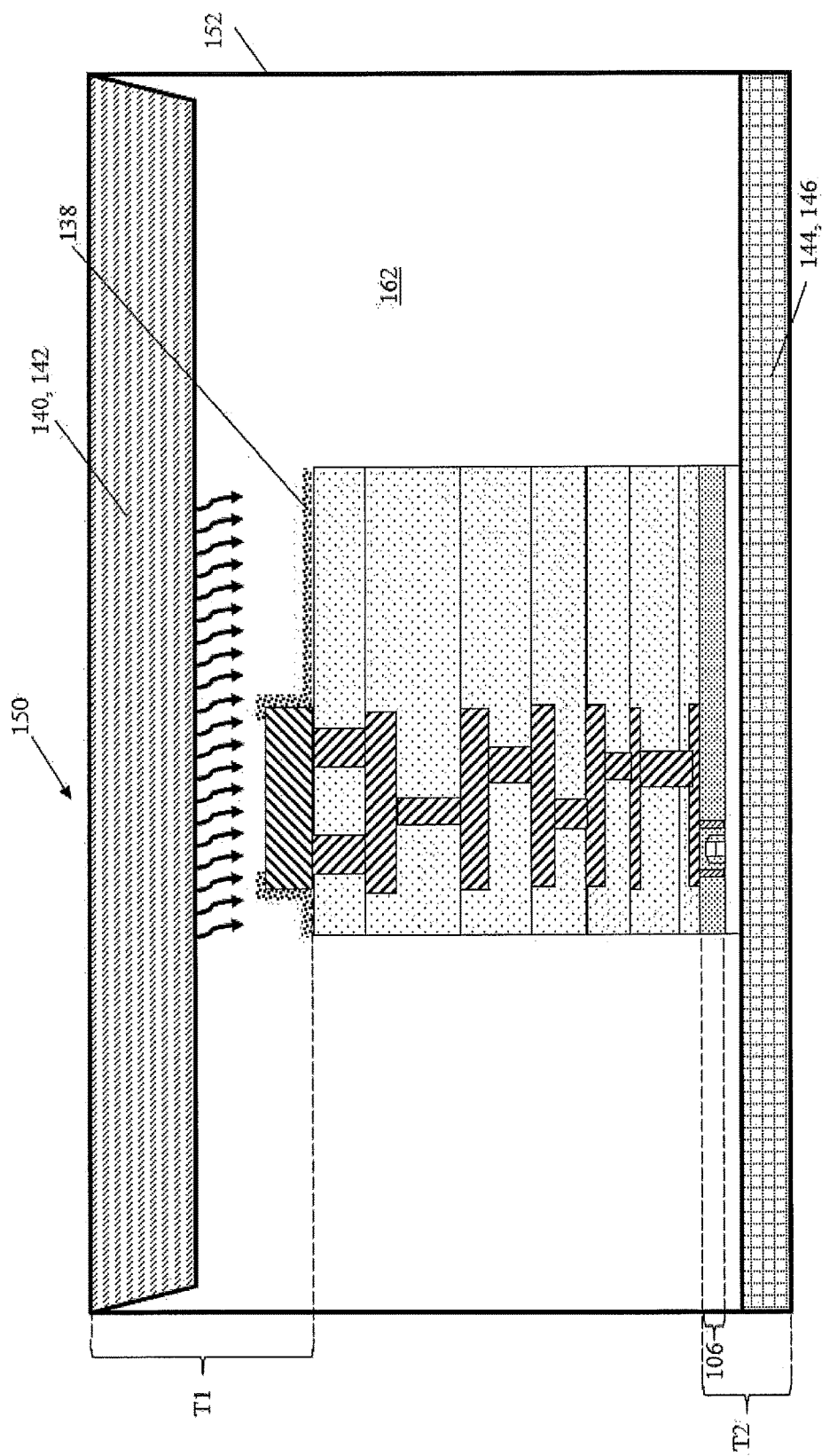
FIG. 8 shows a cross-sectional view of curing the crosslinked precursor passivation layer of FIG. 5 using the curing system of FIG. 7, according to embodiments of the disclosure.

FIG. 8 shows an example of process P3, curing crosslinked precursor passivation layer 124 (FIG. 6) to form passivation layer 138, using curing system 150 after process P3A. As shown in FIG. 8, after placing IC chip 100 in curing system 150 as described with respect to FIG. 7, chamber 152 may be purged with an inert gas 162 for removing volatiles from IC chip 100 and preventing surface oxidation. Inert gas 162 may include, for example, Helium (He), Nitrogen (N2) and/or Argon (Ar). After purging chamber 152 with inert gas 162, thermal source 140 may, for example, be used to control first temperature T1 for curing crosslinked precursor passivation layer 124 (FIG. 7) to form passivation layer 138. Additionally, temperature control device 144 may be used, for example, to maintain device layer 106 at second, lower temperature T2 during the curing of crosslinked precursor passivation layer 124 (see FIG. 6) via thermal source 140. Maintaining device layer 106 at second, lower temperature T2 during the curing of crosslinked precursor passivation layer 124 (FIG. 7) using curing system 150, i.e., temperature control device 144, may mitigate and/or prevent damage to device layer 106 conventionally caused by exposure to first temperature T1.

It is understood that in the flow diagrams shown and described herein, other processes may be performed while not being shown, and the order of processes can be arranged according to various embodiments. Additionally, intermediate processes may be performed between one or more described processes. The flow of processes shown and described herein is not to be construed as limiting of the various embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming a passivation layer on an integrated circuit (IC) chip including a device layer therein, the method comprising:
    curing a precursor passivation layer on the IC chip at a first temperature to form the passivation layer while maintaining the device layer of the IC chip at a second, lower temperature to prevent thermal degradation of the device layer.

2. The method of claim 1, wherein the first temperature is between approximately 30 degrees Celsius to approximately 450 degrees Celsius.

3. The method of claim 1, wherein the second, lower temperature is between approximately 20 degrees Celsius to approximately 350 degrees Celsius.

4. The method of claim 1, wherein a duration of the curing of the precursor passivation layer is between approximately 10 minutes to approximately 5 hours.

5. The method of claim 1, wherein the first temperature is approximately 350 degrees Celsius and the second, lower temperature is approximately 200 degrees Celsius, and wherein a duration of the curing the precursor passivation layer is approximately 2 hours.

6. The method of claim 1, wherein the precursor passivation layer includes a photo sensitive polyimide (PSPI) precursor layer.

7. The method of claim 1, wherein the cured precursor passivation layer includes a photo sensitive polyimide (PSPI) layer.

8. The method of claim 1, further comprising using a curing system for the curing of the precursor passivation layer and the maintaining of the device layer of the IC chip at the second, lower temperature, the curing system including:
    a chamber;
    a thermal source for controlling the first temperature, the thermal source positioned on a first internal surface of the chamber; and
    a temperature control device for controlling the second, lower temperature, the temperature control device positioned on a second internal surface of the chamber, wherein the second internal surface is opposite of the first internal surface.

9. The method of claim 8, wherein using the curing system includes placing the IC chip on the temperature control device, wherein an uppermost surface of the precursor passivation layer is exposed to radiant energy of the thermal source.

10. The method of claim 8, wherein the temperature control device includes a thermoelectric coolant system.

11. The method of claim 8, wherein the thermal source includes a radiation source.

12. The method of claim 11, wherein the radiation source includes an infrared heater.

13. The method of claim 12, wherein the infrared heater includes one of an electrical source and a quartz glass tube.

14. The method of claim 9, further comprising purging the curing system with an inert gas before the curing of the precursor passivation layer.

15. A method of forming a passivation layer of an integrated circuit (IC) chip including a device layer therein, the method comprising:
    crosslinking at least a portion of a precursor passivation layer on the IC chip to form a crosslinked precursor passivation layer; and
    using a radiation source, curing the crosslinked precursor passivation layer at a first temperature to form the passivation layer while using a temperature control device to maintain the device layer at a second, lower temperature to prevent thermal degradation of the device layer.

16. The method of claim 15, wherein the first temperature is between approximately 30 degrees Celsius to approximately 450 degrees Celsius.

17. The method of claim 15, wherein the second, lower temperature is between approximately 20 degrees Celsius to approximately 350 degrees Celsius.

18. The method of claim 15, wherein a duration of the curing the crosslinked precursor passivation layer is between approximately 10 minutes to approximately 5 hours.

19. A method of forming a polyimide layer on an integrated circuit (IC) chip including a device layer therein, the method comprising:
    spin-coating a photosensitive polyimide (PSPI) precursor layer on the IC chip above the device layer;
    crosslinking at least a portion of the PSPI precursor layer to form a crosslinked PSPI precursor layer;
    providing a curing system, the curing system including:
        a chamber,
        a radiation source positioned on a first internal surface of the chamber, and
        a temperature control device positioned on a second internal surface of the chamber, the second internal surface being opposite of the first internal surface;
    placing the IC chip and crosslinked PSPI precursor layer in the chamber, including positioning the device layer on the temperature control device of the curing system, wherein an uppermost surface of the crosslinked PSPI precursor layer is exposed to radiant energy of the radiation source;

purging the curing system with an inert gas; and using the radiation source, curing the crosslinked PSPI precursor layer at a first temperature to form a polyimide layer while maintaining the device layer at a second, lower temperature to prevent thermal degradation of the device layer.

20. The method of claim 19, wherein a duration of the curing the crosslinked PSPI precursor layer includes a duration of approximately 10 minutes to approximately 5 hours.

* * * * *